United States Patent

Dueme

[11] Patent Number: 5,880,640
[45] Date of Patent: Mar. 9, 1999

[54] DISTRIBUTED AMPLIFIER FOR WIDE BAND HYPERFREQUENCY SIGNALS

[75] Inventor: Philippe Dueme, Saint-Cloud, France

[73] Assignee: Dassault Electronique, Saint-Cloud, France

[21] Appl. No.: 605,165

[22] Filed: Oct. 23, 1990

[30] Foreign Application Priority Data

Nov. 24, 1989 [FR] France ................... 89 15497

[51] Int. Cl.$^6$ ................................ H03F 3/60
[52] U.S. Cl. ................ 330/303; 330/306; 330/277; 330/179
[58] Field of Search .................... 357/22; 330/303, 330/304, 306, 277, 286, 296, 54, 128, 132, 133, 134, 177, 178, 179, 180

[56] References Cited

U.S. PATENT DOCUMENTS

| | | | |
|---|---|---|---|
| 4,668,920 | 5/1987 | Jones | 330/54 X |
| 4,772,858 | 9/1988 | Tsukii et al. | 330/277 |
| 4,973,918 | 11/1990 | Schindler | 330/54 X |
| 5,021,743 | 6/1991 | Chu et al. | 330/54 |

FOREIGN PATENT DOCUMENTS 0196098  10/1986  European Pat. Off. ............ 330/277

*Primary Examiner*—Nelson Moskowitz
*Attorney, Agent, or Firm*—Stevens, Davis, Miller & Mosher, L.L.P.

[57] ABSTRACT

The invention relates to a distributed amplifier for wide band hyperfrequency signals of the type comprising:

a plurality of basic amplifying cells ($C_1$ to $C_n$) mounted in series, with at least one common drain line (Ld) and at least one common grid line (Lg), each cell comprising at least one field effect transistor ($T_1$) which is common-source mounted and filtering elements, first biasing means for applying a first biasing voltage (Vd) to the common drain line, and second biasing means for applying a second biasing voltage to the common grid line. According to the main feature of the invention, the first biasing means comprise a plurality of auxiliary field effect transistors ($T'_1$ to $T'_n$) functioning in saturable load mode and whose respective sources ($S'_1$ to $S'_n$) are distributively connected up to the common drain line (Ld) and whose respective drains ($D'_1$ to $D'_n$) receive in series the first biasing voltage (Vd).

8 Claims, 4 Drawing Sheets

DISTRIBUTED AMPLIFIER FOR WIDE BAND HYPERFREQUENCY SIGNALS

FIELD OF THE INVENTION

The invention relates to distributed amplifiers for wide band hyperfrequency signals. It finds an application in the manufacture of microwave or hyperfrequency monolithic integrated circuits.

BACKGROUND OF THE INVENTION

Generally, a distributed amplifier comprises a plurality of basic amplifying cells, mounted in series with at least one common drain line and one common grid line. Each basic amplifying cell comprises at least one field effect transistor which is common-source mounted and connected to the common drain line by its drain and to the common grid line by its grid.

The correct functioning of a field effect transistor requires the application of a first d.c. biasing voltage to its drain, on the one hand, and the application of a second d.c. biasing voltage to its grid on the other hand. In a distributed amplifier, the common drain line receives the first biasing voltage whilst the common grid line receives the second biasing voltage.

Sometimes, layouts use basic amplifying cells mounted in series with two common grid lines and one common drain line, each comprising several field effect transistors.

The basic requirements for the correct functioning of a distributed amplifier for wide band hyperfrequency signals relate to the filtering of the biasing circuits. These biasing circuits must in fact allow the d.c. biasing currents or voltages to pass but isolate the hyperfrequency power.

Most often, this filtering is carried out through the terminal resistors of the common grid and drain lines which can be coupled in series with a decoupling capacitor.

The filtering of the biasing of the common grid lines through their terminal resistor coupled in series with a decoupling capacitor is satisfactory insofar as the d.c. grid current is low and no voltage drop appears in the terminal grid resistors.

On the other hand, the filtering of the biasing of the common drain lines through their terminal resistor coupled in series with a decoupling capacitor is not suitable insofar as the d.c. drain current is high (for example 500 milliamperes for a distributed power amplifier of the order of 1 watt), which results in biasing voltage drops of the order of 25 volts for terminal drain resistors of value of the order of 50 ohms, and in consequence in a rise in the biasing voltage up to values not usually used in the field of integrated circuits.

The other disadvantages of the filtering of the biasing circuits through terminal grid or drain resistors are the large energy losses which occur around the said terminal resistors and the use of wide conductors occupying a lot of space on the semiconducting disc and which are necessary to bear the totality of the d.c. drain biasing current crossing the section of the common drain line which is connected up to the terminal drain resistor.

The filtering of the biasing circuits may also be carried out through reactive elements possibly coupled in parallel through a capacitor connected to earth. This type of filtering is satisfactory in the case of hybrid integrated circuits or discretely mounted field effect transistors.

On the other hand, in microwave monolithic integrated circuit technology, reactive elements are not suitable either when they are constructed in in-chip integrated form, or when they are constructed outside the said chip.

In fact, the filtering of the biasing circuits through reactive elements has the disadvantage of downgrading the performance levels of the distributed amplifier, in particular its impedance matching insofar as the reactive filtering elements may exhibit a disturbing natural resonance phenomenon, more particularly when a wide band distributed amplifier having a band of the order of 40 gigahertz is concerned. Moreover, these elements should, in the case of a power amplifier, bear a biasing current which is often incompatible with the size of the conducting wires.

When the reactive elements are mounted in external fashion on the integrated circuit, their dimensions lead, at least in their current construction, to a large spatial requirement which is very awkward in the construction of a microwave monolithic integrated circuit. Furthermore, their layout on the integrated circuit requires additional external connections as well as soldered joints whose implementation is difficult and sometimes awkward on a monolithic integrated circuit.

In known circuits other than power amplifiers, the filtering of the biasing circuits of the field effect transistors is ensured by an additional field effect transistor working in saturated mode. Nevertheless, the application of this type of filtering to the biasing circuits of a power amplifier is not possible.

SUMMARY OF THE INVENTION

The aim of the invention consists in providing a distributed amplifier for wide band hyperfrequency signals which does not exhibit the disadvantages of the known amplifiers.

In particular, the invention enables a filtering of the biasing circuits of a distributed amplifier which solves the problems associated with the prior structures.

The filtering of biasing circuits with an additional field effect transistor, functioning in saturable load mode, has the advantage of enabling a saving in area on the semiconductor disc relative to reactive elements.

However, such a filtering would not be satisfactory if it were applied to a high power distributed amplifier since the field effect transistor mounted in saturable load mode would then dissipate this power over a very localized region, causing thermal problems as well as electrical disturbances incompatible with the correct functioning of the distributed amplifier. More precisely, the transistor functioning in saturable load mode should by itself allow the entire sum of the d.c. biasing currents of the field effect transistors of the distributed amplifier to pass. This transistor would therefore have a size substantially equal to the sum of the grid widths of the field effect transistors of the distributed amplifier. Now, the larger becomes the field effect transistor functioning in saturable load mode, the smaller becomes its resistance since the latter is inversely proportional to the size of the field effect transistor. Thus, in consequence, the field effect transistor mounted in saturable load mode will no longer exhibit a sufficiently high hyperfrequency impedance to adequately filter the biasing circuits of the distributed amplifier.

In other words, if the expert wishes to bias a plurality of cells of a distributed power amplifier through a field effect transistor functioning in saturable load mode, he will see that he will be obliged to use a large field effect transistor to bear the totality of the biasing current. Now, such a transistor exhibits a low dynamic impedance. It follows that there is a contradiction between the use of a large field effect transistor functioning in saturable load mode and the hyperfrequency filtering requirements of the biasing circuits.

The Applicant Company has observed surprisingly that by dividing a field effect transistor functioning in saturable load mode into a plurality of field effect transistors also functioning in saturable load mode, the abovementioned problems were, with a few adjustments, overcome.

The invention relates to a distributed amplifier for wide band hyperfrequency signals of the type comprising:

a plurality of basic amplifying cells mounted in series, with at least one common drain line and at least one common grid line, each cell comprising at least one field effect transistor which is commonsource mounted and filtering elements;

first biasing means for applying a first biasing voltage to the common drain line; and second biasing means for applying a second biasing voltage to the common grid line.

According to a general definition of the invention, the first biasing means comprise:

a plurality of auxiliary field effect transistors functioning in saturable load mode and whose respective sources are distributively connected up to the common drain line and whose respective drains receive in series the first biasing voltage.

According to one aspect of the invention, the distributed amplifier furthermore comprises third biasing means for delivering a third biasing voltage whilst the grids of the auxiliary transistors receive in series this third biasing voltage through a resistor respectively.

Advantageously, the third biasing voltage is connected to earth in parallel through a decoupling capacitor.

According to a first preferred embodiment of the invention, each basic amplifying cell comprises a field effect transistor which is common-source mounted, its grid being connected to the common grid line and its drain being connected to the common drain line.

According to a second preferred embodiment of the invention, the distributed amplifier comprises a plurality of basic amplifying cells mounted in series, with a common drain line and first and second common grid lines, whilst each cell comprises three field effect transistors interconnected among themselves in combination with filtering elements, the first and second transistors, which are common-source mounted, being respectively connected to the first common grid line and to the second common grid line by their respective grids, whilst their respective drains are interconnected, the third transistor, which is common-grid mounted, having its source connected to the drains of the first and second transistors and having its drain connected to the common drain line.

According to a third preferred embodiment of the invention, the distributed amplifier comprises a plurality of basic amplifying cells mounted in series, with a common drain line and a common grid line, whilst each cell comprises two field effect transistors interconnected among themselves in combination with filtering elements, the first transistor, which is common-source mounted, being connected to the common grid line by its grid, the second transistor, which is common-grid mounted, having its drain connected to the common drain line, the drain of the first transistor being connected up to the source of the second transistor.

In practice, the sum of the grid widths of the auxiliary field effect transistors is substantially equal to or less than the sum of that of the field effect transistors of the basic amplifying cells which are distributively connected up to the common drain line.

BRIEF DESCRIPTION OF THE DRAWINGS

Other features and advantages of the invention will emerge on studying the detailed description below, and the attached drawings, in which.

The attached drawings comprise for the most part elements of definite character. They will therefore be able not only to serve in making the detailed description better understood but also to contribute to the definition of the invention, as appropriate.

DETAILED DESCRIPTION OF THE INVENTION

Figure 1:
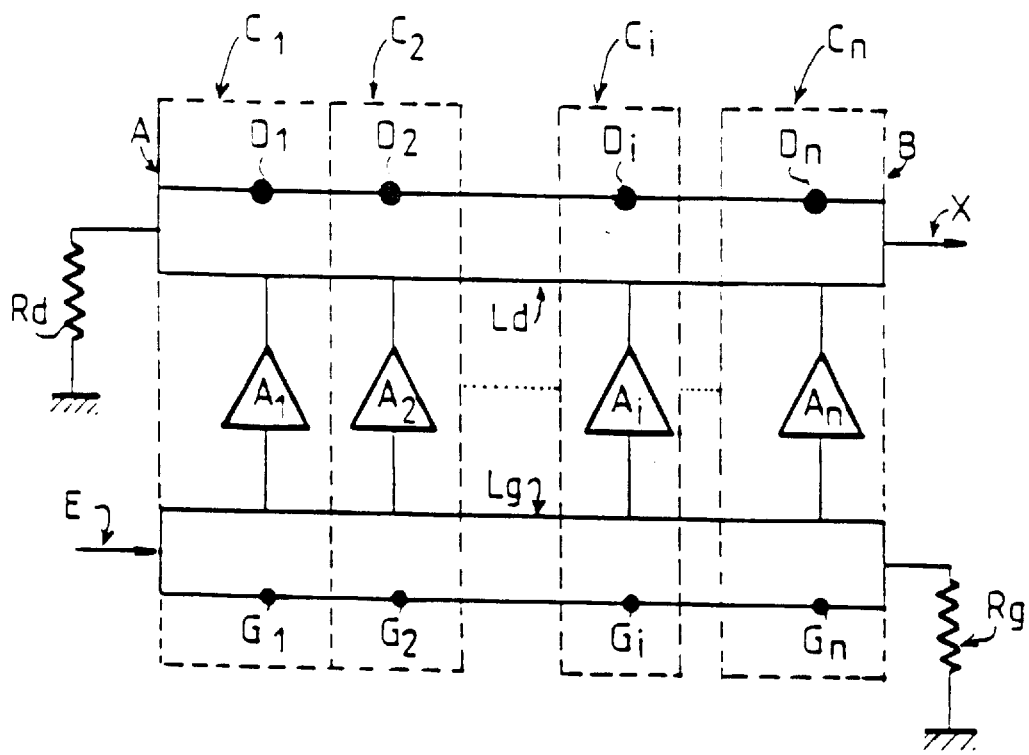
FIG. 1 is the wiring diagram of a distributed hyperfrequency amplifier with one common drain line of known type.

FIG. 1 illustrates a known distributed amplifier. It consists of a plurality of basic amplifying cells $C_1$ to $C_n$, mounted in series with a common drain line Ld and a grid line Lg. Each cell, such as the cell $C_1$, comprises an amplifying structure $A_1$ based on at least one field effect transistor which is common-source mounted and interconnected between a point $D_1$ of the common drain line Ld and a point $G_1$ of the common grid line Lg. The front of the common grid line Lg forms the input E of the amplifier. At the other end, this line is loaded onto an impedance Rg which is substantially equal to the characteristic impedance of the common grid line. Conversely, at the front, the common drain line Ld is loaded onto an impedance Rd substantially equal to the characteristic impedance of the common drain line, whilst at the other end, this line defines the output X of the distributed amplifier.

A biasing circuit (not shown) applies a d.c. biasing voltage to the common drain line Ld whilst another biasing circuit (not shown) applies another d.c. biasing voltage to the common grid line Lg. These biasing circuits are filtered to allow the d.c. biasing currents or voltages to pass whilst isolating the hyperfrequency power.

Most often, these biasing circuits are filtered by reactive elements coupled in parallel with a capacitor which is connected to earth, with the disadvantages which are known.

It will be recalled that the cells are not necessarily identical, so that the layout does not necessarily exhibit all of the symmetries appearing in FIG. 1.

The operating principle of a distributed amplifier is the following:

The input signal spreads over the common grid line Lg. Each amplifying structure, such as that referenced $A_1$, receives this signal between its grid point $G_1$ and its drain point $D_1$, and supplies the common drain line with an amplified version of the input signal, a version which spreads over this common drain line Ld.

Figure 2:
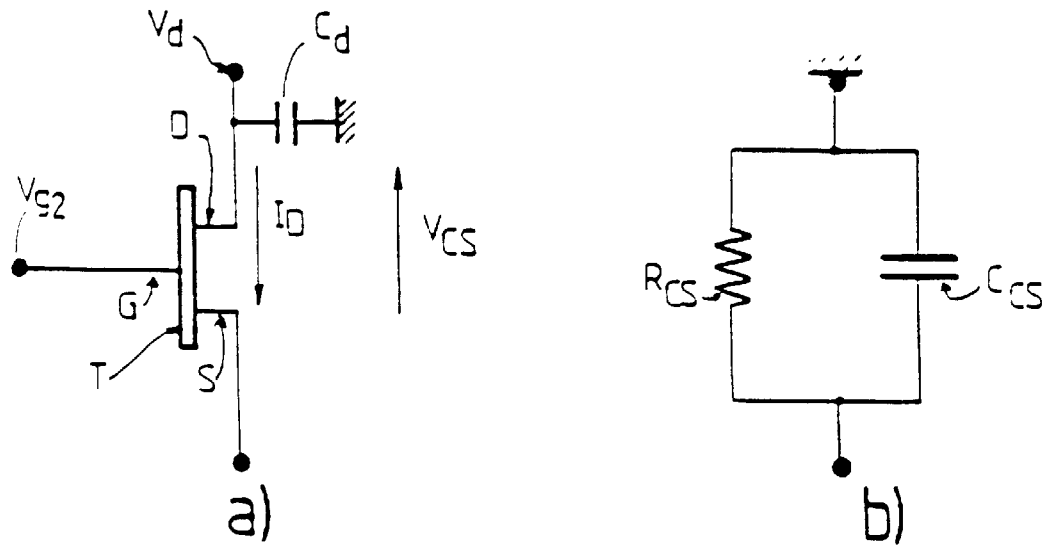
FIG. 2A is a schematic view of a field effect transistor functioning in saturable load mode whilst
FIG. 2B is its equivalent diagram.

FIG. 2A illustrates a field effect transistor T working in saturable load mode, whilst FIG. 2B represents its equivalent diagram.

The biasing of the grid G is ensured by a voltage $Vg_2$. The drain D is biased by a voltage Vd decoupled from earth by a capacitor Cd. The transistor T ensures the passage of a large d.c. current Id up to its source S whilst exhibiting a high hyperfrequency dynamic impedance due to the saturation of the current Id. It is for this reason that the transistor T is referred to as being in saturable load mode since it is well known that when the drain current curves of a field effect transistor are drawn as a function of the drain voltage, these curves rapidly show a saturation.

The equivalent diagram in alternate mode of a field effect transistor functioning in saturable load mode comprises a resistor Rcs with a capacitor Ccs in parallel. The high dynamic impedance is reflected through a resistor Rcs of high value and through a capacitor Ccs of low value.

Figure 3:
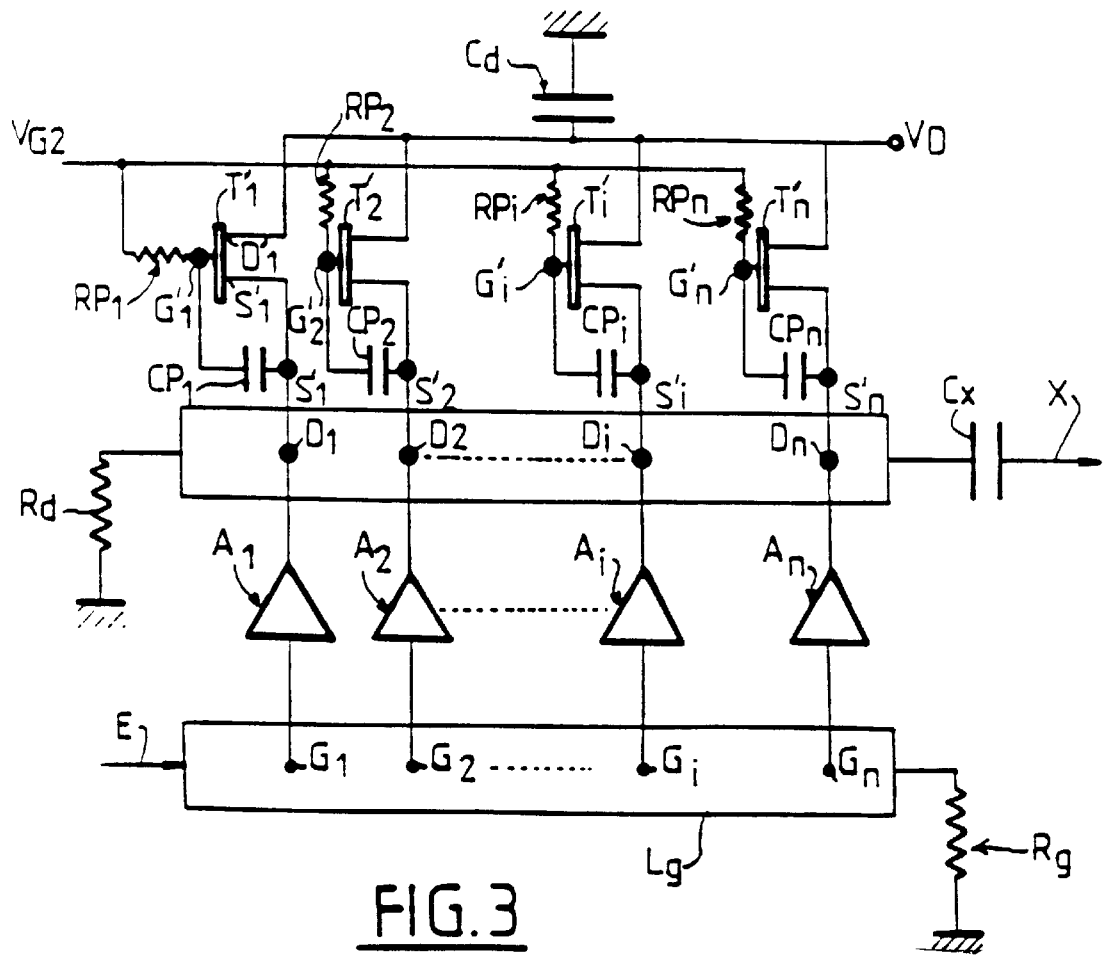
FIG. 3 is the wiring diagram of a distributed hyperfrequency amplifier with one common drain line biased according to the invention.

FIG. 3 illustrates the distributed amplifier described in relation to FIG. 1, in which amplifier are incorporated the filtering means of the biasing circuit of the common drain line according to the invention.

According to the invention, at each point $D_1$ to $D_n$ of the common drain line at which a field effect transistor T of an amplifying cell is respectively connected by its drain, an auxiliary field effect transistor T' functioning in saturable load mode is respectively and distributively connected up by its source S'.

The respective drains D' of the auxiliary field effect transistors receive in series the biasing voltage Vd. This biasing voltage Vd is connected to earth through a decoupling capacitor Cd mounted in parallel.

The auxiliary field effect transistors T' have their source S' connected to their grid G' through an auxiliary capacitor CP respectively, itemized as $CP_1$ to $CP_n$.

The grids G', itemized as $G'_1$ to $G'_n$, of the auxiliary field effect transistors receive in series an auxiliary d.c. biasing voltage $Vg_2$ respectively through a resistor RP of high value itemized as $RP_1$ to $RP_n$.

The thus produced filtering of the biasing circuit of the common drain line makes it possible, on the one hand, to not concentrate the source of heat generated by the saturation current crossing the field effect transistor into a single region and, on the other hand, to divide up the electrical disturbances. More precisely, instead of a single impedance (Rcs/Ccs) connected up to a point of the common drain line, use is now made of n dynamic impedances (Rcs/n/n.Ccs) if the n cells have identical auxiliary field effect transistors) which are n times higher than the lone impedance (Rcs//Ccs).

Moreover, these n dynamic impedances are easier to take into account during the design of a distributed amplifier by microwave monolithic integrated circuit technology since these disturbing impedances can be easily integrated into each basic amplifying cell. Finally, the proportion of the disturbing capacitance Ccs of each cell may easily be taken into account when calculating the capacitance of the common drain line.

Finally, such a filtering enables a local current overload of the common drain line to be avoided. In fact, each cell is now fed separately. Furthermore, the division of the total biasing current into n cellular biasing currents enables the use of straightforward conducting wires occupying a small area on the semiconducting disc.

Figure 4:
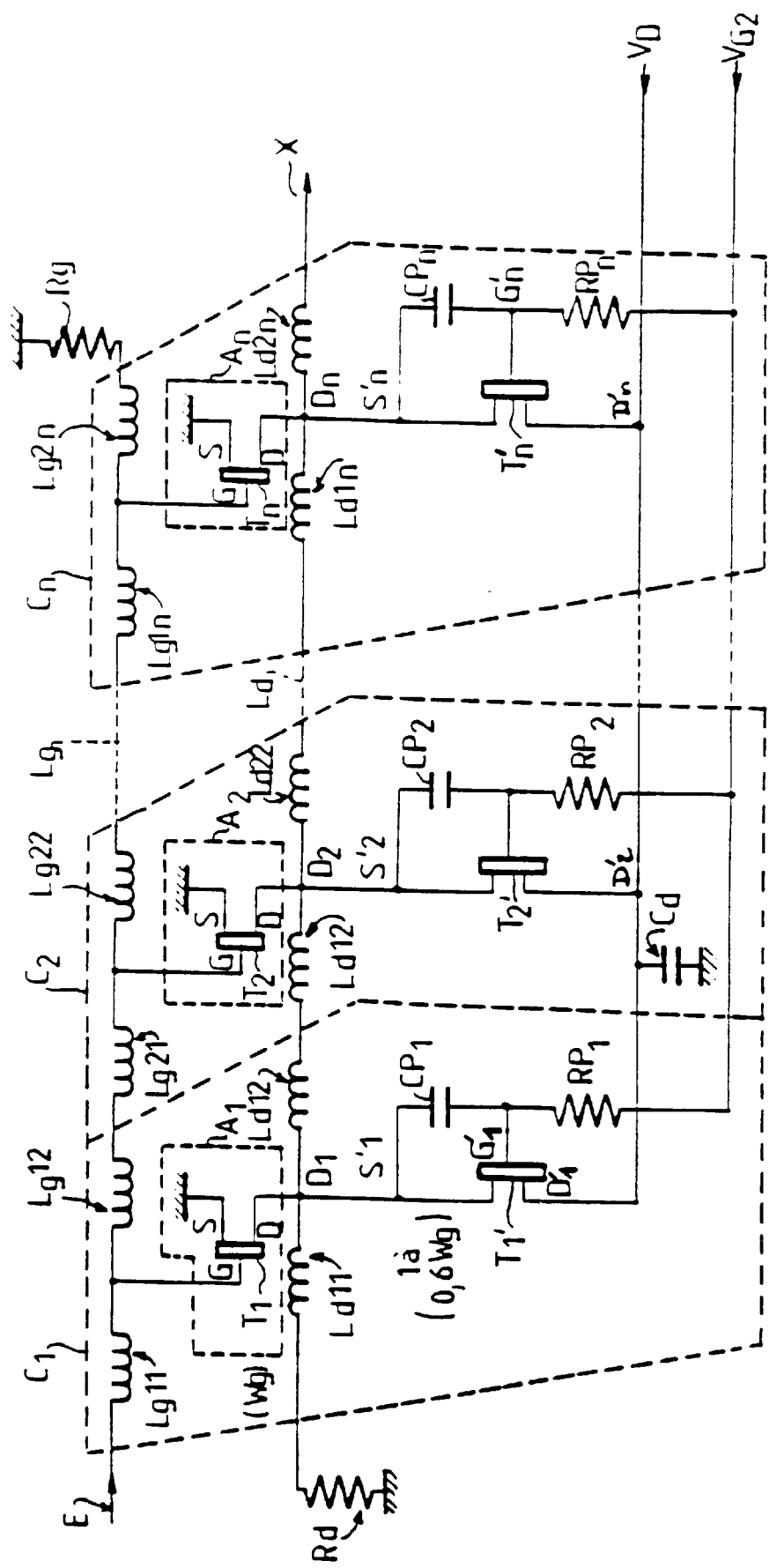
FIG. 4 illustrates a plurality of cells for a distributed hyperfrequency amplifier with one common grid line and one common drain line biased according to the invention.

In FIG. 4 has been represented a distributed amplifier comprising a plurality of cells $C_1$ to $C_n$ mounted in series with a common grid line and a common drain line biased according to the invention.

Each basic amplifying cell comprises a field effect transistor $T_1$ which is common-source mounted, its grid G being connected to the common grid line through grid filtering elements and its drain D being connected to the common drain line through drain filtering elements.

More particularly, its grid G is connected to the common point of two inductors, one of which $Lg_{11}$ goes towards the input of the common grid line and the other $Lg_{12}$ towards its output (for this cell). Similarly, the drain D of the field effect transistor $T_1$ is connected to the common point of two inductors, the one $Ld_{11}$ going towards the input, and the other $Ld_{12}$ towards the output of the distributed amplifier.

According to the invention, the source $S'_1$ of an auxiliary field effect transistor $T'_1$ is for example connected up to the common point of the two inductors $Ld_{11}$ and $Ld_{12}$.

Advantageously, the auxiliary field effect transistor functioning in saturable load mode is matched to the transistor which it is going to bias. The field effect transistor of the amplifying structure can therefore be made to work at the same operating point as the auxiliary field effect transistor which biases it. Thus, if the grid width of the field effect transistor of the amplifying structure is Wg, the grid width of the auxiliary field effect transistor which However, it may be advantageous to make the field effect transistor of the amplifying structure work only under a drain current Id smaller than that crossing the auxiliary field effect transistor which biases it. It results therefrom that the auxiliary field effect transistor is x times smaller than the field effect transistor of the amplifying structure. An auxiliary field effect transistor exhibiting a dynamic impedance x times larger is also obtained. For example, the grid width of the auxiliary field effect transistor is 0.6 Wg where Wg is the grid width of the field effect transistor of the amplifying structure.

The invention may also be applied to distributed amplifiers which are "cascode" mounted, like those described in French Patent Application 87 16 277, filed by the Applicant Company on the 24th November 1987.

Figure 5:
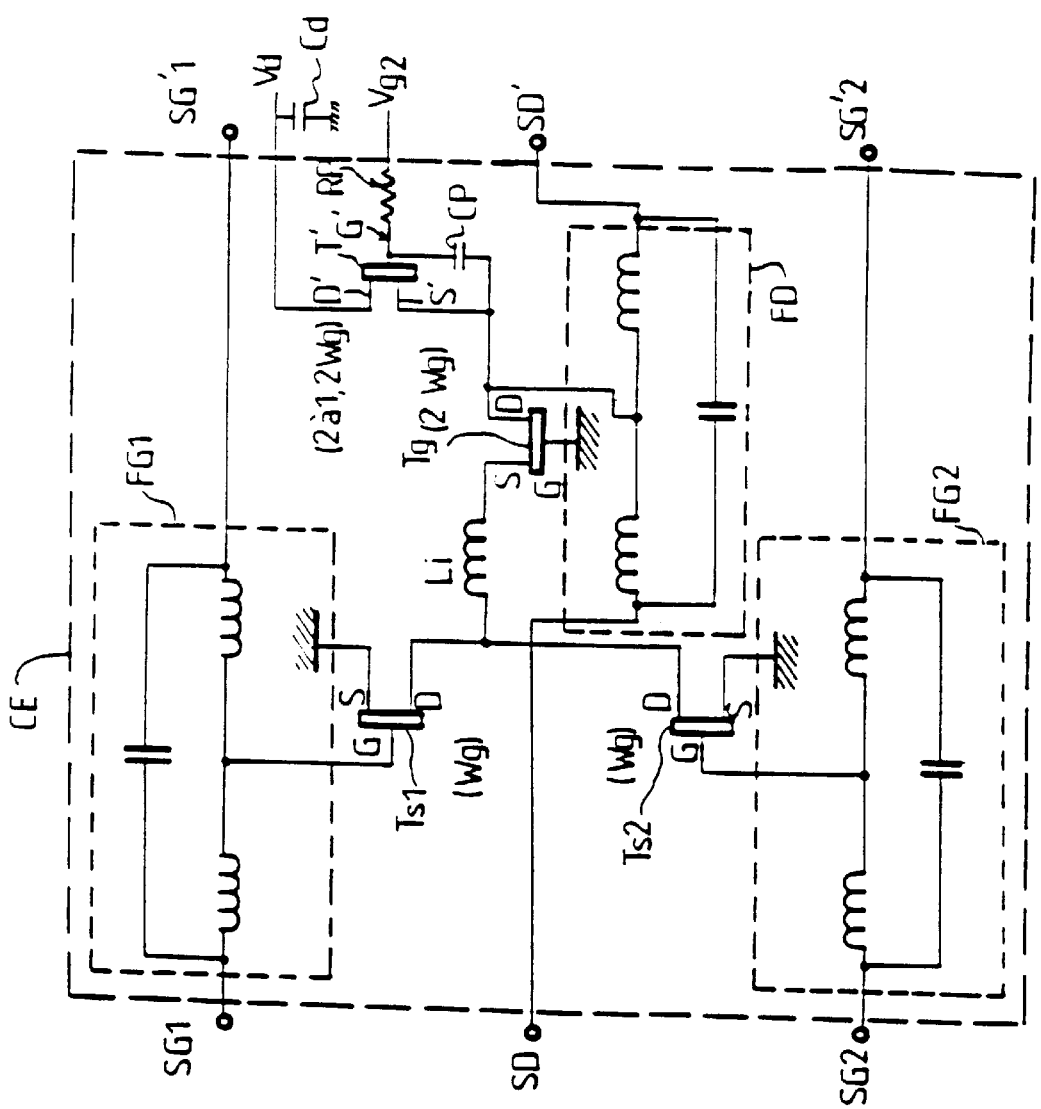
FIG. 5 illustrates a cell for a distributed amplifier with two common grid lines and one common drain line biased according to the invention.

In FIG. 5 has been represented a cell CE of such a distributed amplifier.

The cell CE comprises two grid lines $SG_1$–$SG'_1$ and $SG_2$–$SG'_2$ respectively, and one drain line SD–SD'. The two grid lines are equipped with filtering cells, preferably of all-pass type, $Fg_1$ and $Fg_2$ respectively. Refer to the above patent application for a detailed description of the cell CE.

The all-pass function is complemented by the grid-source capacitance of the common-source transistor ($TS_1$ or $TS_2$), associated with the relevant grid line. The drains of the two transistors $TS_1$ and $TS_2$ are directly connected. This connection between the two drains is applied through an inductor LI to the source of a transistor Tg which is common-grid mounted. The drain of this transistor is connected to another, preferably all-pass, cell Fd.

According to the invention, the source S' of an auxiliary field effect transistor T' mounted in saturable load mode is connected up to the drain of the transistor Tg.

The transistor T functions in the same way as the auxiliary field effect transistors described in relation to FIG. 3. As before, the biasing voltage Vd is applied to the drain D' of the transistor T through a decoupling capacitor Cd mounted in parallel. The additional capacitor Cdd going towards earth has been omitted in the cell CE described in the patent application mentioned earlier. In fact, this additional capacitor Cdd may be integrated with the disturbing capacitances of the reactive elements. As before, the biasing voltage $Vg_2$ is applied to the grid G' of the auxiliary field effect transistor T' through a resistor RP. Similarly, its source S' is connected to its grid G' through an auxiliary capacitor CP.

In this cell CE the transistors $TS_1$ and $TS_2$ have a grid width equal to Wg, whilst the transistor Tg has a grid width equal to 2×Wg. Thus, the auxiliary field effect transistor T' intended for biasing the transistor Tg may have for example a grid width varying from 1.2 to 2 Wg for the reasons invoked in relation to FIG. 4.

Generally, the invention may be applied to the filtering of the biasing circuits for microwave monolithic integrated circuits. It may also be applied to the filtering of the biasing circuits of the cells of an upstream stage preceding a distributed amplifier.

I claim:

1. Distributed amplifier for wide band hyperfrequency signals of the type comprising:
   a plurality of basic amplifying cells ($C_1$ to $C_n$) mounted in series, with at least one common drain line Ld and at least one common grid line Lg, each cell comprising at least one field effect transistor $T_1$ which is common-source mounted and filtering elements $Lg_{11}$, $Lg_{12}$)
   first biasing means for applying a first biasing voltage Vd to the common drain line;
   second biasing means for applying a second biasing voltage to the common grid line,
   characterized in that the first biasing means comprise:
       a plurality of auxiliary field effect transistors $T'_1$ to $T'_n$ functioning in saturable load mode and whose respective sources $S'_1$ to $S'_n$ are distributively connected up to the common drain line Ld and whose respective drains $D'_1$ to $D'_n$ receive in series the first biasing voltage Vd.

2. Amplifier according to claim 1, characterized in that it furthermore comprises third biasing means for delivering a third biasing voltage $Vg_2$ and in that the grids $G'_1$ to $G'_n$ of the auxiliary transistors receive in series the third biasing voltage $Vg_2$ through a resistor $Rp_1$ to $Rp_n$ respectively.

3. Amplifier according to claim 1 or 2, characterized in that the auxiliary field effect transistors $T_1$ to $T'_n$ have their source $S'_1$ to $S'_n$ connected to their grid $G'_1$ to $G'_n$ through an auxiliary capacitor $CP_1$ to $CP_n$ respectively.

4. Amplifier according claim 1 or 2 characterized in that the first biasing voltage Vd is connected to earth in parallel through a decoupling capacitor Cd.

5. Amplifier according claim 1 or 2, characterized in that the sum of the grid widths of the auxiliary field effect transistors ($T'_1$ to $T'_n$ is substantially equal to or less than the sum of that of the transistors $T_1$ to $T_n$ of the basic amplifying cells $T_1$ to $C_n$ which are distributively connected up to the common drain line Ld.

6. Amplifier according to claim 1 or 2 characterized in that each basic amplifying cell comprises a field effect transistor which is common-source mounted, its grid being connected to the common grid line through filtering elements and its drain being connected to the common drain line through filtering elements.

7. Amplifier according to of claim 1 or 2 characterized in that the plurality of basic amplifying cells are mounted in series, with a common drain line SD–SD' and first $SG_1$–$SG_1'$ and second $SG_2$–$SG_2'$ common grid lines, and in that each cell CE comprises three field effect transistors interconnected among themselves in combination with filtering elements, the first $TS_1$ and second $TS_2$ transistors, which are common-source mounted, being respectively connected to the first common grid line $SG_1$–$SG_1'$ and to the second common grid line $SG_2$–$SG_2'$ by their respective grids, whilst their respective drains are interconnected to the third transistor Tg, which is common-grid mounted, having its source connected to the drains of the first and second transistors and having its drain connected to the common drain line SD–SD'.

8. Amplifier according to claim 1 or 2, characterized in that it comprises a plurality of basic amplifying cells mounted in series, with a common drain line and a common grid line, and in that each cell comprises two field effect transistors interconnected among themselves in combination with filtering elements, the first transistor, which is common-source mounted, being connected to the common grid line by its grid, the second transistor, which is common-grid mounted, having its drain connected to the common drain line, whilst the drain of the first transistor is connected to the source of the second transistor.

* * * * *